(12) United States Patent
Le et al.

(10) Patent No.: US 6,262,469 B1
(45) Date of Patent: Jul. 17, 2001

(54) CAPACITOR FOR USE IN A CAPACITOR DIVIDER THAT HAS A FLOATING GATE TRANSISTOR AS A CORRESPONDING CAPACITOR

(75) Inventors: Binh Quang Le, Mountain View; Pau-Ling Chen, Saratoga; Shane Charles Hollmer, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/047,237

(22) Filed: Mar. 25, 1998

(51) Int. Cl.[7] ............... H01L 29/00; H01L 21/8242; H01L 21/20
(52) U.S. Cl. .......................... 257/532; 438/252; 438/395
(58) Field of Search ................. 257/532; 438/251, 438/252, 394, 395

(56) References Cited

U.S. PATENT DOCUMENTS 4,665,355 * 5/1987 McCollum et al. ................. 323/237
4,786,828 * 11/1988 Hoffman ............................. 257/532
5,530,275 * 6/1996 Widdershoven ..................... 257/219

FOREIGN PATENT DOCUMENTS 57-071165 * 5/1982 (JP) ..................... 257/532

* cited by examiner

Primary Examiner—Olik Chaudhuri
Assistant Examiner—Howard Weiss
(74) Attorney, Agent, or Firm—Skjerven Morrill MacPherson LLP; Edward C. Kwok

(57) ABSTRACT

A capacitor divider includes two capacitors coupled in series between two voltage sources. A first capacitor is a floating gate capacitor having one plate being the control gate of a floating gate transistor structure and the other plate being a source, drain, and channel region of the floating gate transistor structure. The capacitive divider has the advantage of having at least one floating gate capacitor, can be implemented in a voltage regulator, and works for a variety of voltages across the capacitors.

13 Claims, 3 Drawing Sheets

CAPACITOR FOR USE IN A CAPACITOR DIVIDER THAT HAS A FLOATING GATE TRANSISTOR AS A CORRESPONDING CAPACITOR

CROSS REFERENCE TO RELATED APPLICATIONS

This application is related to application, Ser. No. 09/023, 497, entitled "Floating Gate Capacitor for Use in Voltage Regulators" (hereinafter "the related application") filed on Feb. 13, 1998, now U.S. Pat. No. 6,137,153 commonly assigned with the present invention, and incorporated by reference herein in its entirety.

FIELD OF THE INVENTION

The present invention relates to capacitor dividers. More specifically, it relates to a capacitor for use in a capacitor divider having a floating gate capacitor as a corresponding capacitor.

BACKGROUND OF THE INVENTION

Capacitor dividers and voltage regulators are well known in the art. FIG. 1 shows a capacitor divider in a conventional voltage regulator. Regulator 100 includes a capacitor divider 110 which includes high and low capacitors 120 and 130 coupled in series between two voltage sources $V_{pp}$ and $V_{ss}$. The common electrical node between high and low capacitors 120 and 130 is a divider output line 140 which is an input line to comparator 160 and carries a varying voltage of $V_{div}$. A reference line 150 having a reference voltage $V_{ref}$ asserted thereon is the second input line to comparator 160. Comparator 160 asserts a signal onto comparator output line 170 which is coupled to a control gate of transistor 180 which has a source coupled to $V_{ss}$ and a drain coupled to $V_{pp}$.

Maintaining a constant capacitive ratio (k) of the capacitor divider 110 as defined by equation 1 improves the performance of capacitor divider 110 and regulator 100.

$$K=C1/(C1+C2) \quad (1)$$

where:
C1=Capacitance of high capacitor 120, and
C2=Capacitance of low capacitor 130.

SUMMARY OF THE INVENTION

A capacitor divider includes two capacitors coupled in series between two voltage sources. A first capacitor is a floating gate capacitor having one plate being the control gate of a floating gate transistor structure and the other plate being a source, drain, and channel region of the floating gate transistor structure. The capacitive divider has the advantage of having at least one floating gate capacitor, can be implemented in a voltage regulator, and works for a variety of voltages across the capacitors.

DESCRIPTION OF THE INVENTION

Figure 2:
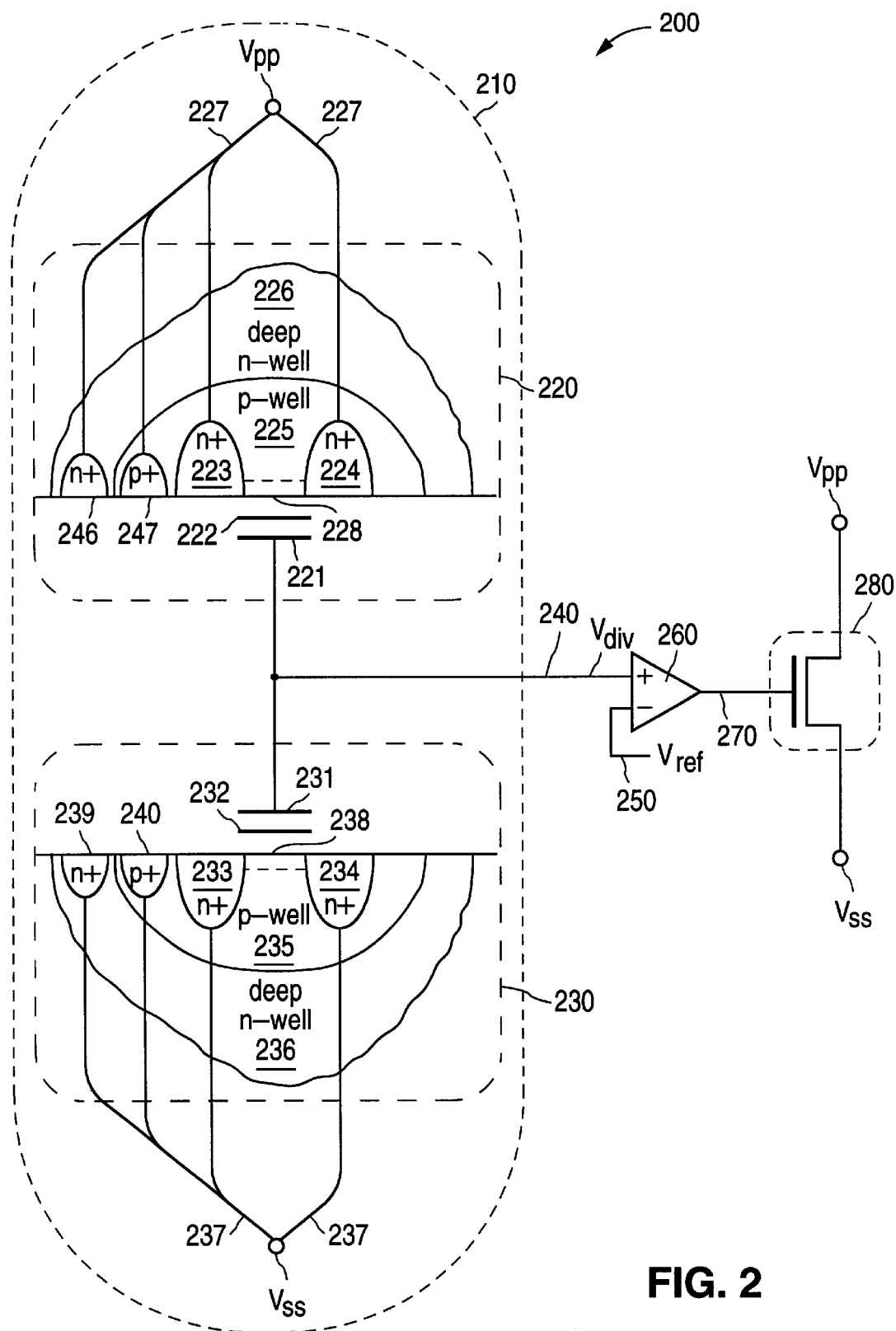
FIG. 2 is a schematic diagram of a voltage regulator having a capacitor divider which uses the floating gate capacitor described in the related application as a low capacitor.

FIG. 2 is a schematic diagram of a voltage regulator 200 having a capacitor divider 210 which uses the floating gate capacitor described in the related application as a low capacitor 230. Capacitor divider 210 has respective high and low capacitors 220 and 230 coupled in series between two voltage sources $V_{pp}$ and $V_{ss}$. The connection between high and low capacitors 220 and 230 is a divider output line 240 which is an input line to a comparator 260 and carries a varying voltage of $V_{div}$. A reference line 250 having a reference voltage $V_{ref}$ asserted thereon is the second input line to comparator 260. A comparator output line 270 is coupled to the gate of transistor 280.

The structure and advantages of low capacitor 230 shown in FIG. 2 are described in the related application. Low capacitor 230 includes control gate 231; floating gate 232; n+ regions 233 and 234; p-well 235; deep n-well 236; lines 237 coupling n+ regions 233 and 234, p-well 235, and deep n-well 236 to voltage source $V_{ss}$; and n-channel region 238 induced by a positive charge on floating gate 232. P-well 235 and deep n-well 236 contact lines 237 at p+ contact region 240 and n+ contact region 239, respectively. Thus, n+ regions 233 and 234, p-well 235, deep n-well 236, and lines 237 are shorted together to form one plate of low capacitor 230 while control gate 231 forms the other plate of low capacitor 230. Low capacitor 230 has a positive charge on floating gate 232 ("erased state") such that channel region 238 is present even when the control gate is grounded as would be the case in a regulator in which $V_{div}$ is initialized at ground and $V_{ss}$ is grounded.

High capacitor 220 includes control gate 221; floating gate 222; n+ regions 223 and 224; p-well 225; deep n-well 226; lines 227 coupling n+ regions 223 and 224, p-well 225, and deep n-well 226 to voltage source $V_{pp}$; and channel region 228. P-well 225 and deep n-well 226 contact lines 227 at p+ contact region 247 and n+ contact region 246, respectively. Thus, n+ regions 223 and 224, p-well 225, deep n-well 226, and lines 227 are shorted together to form one plate of high capacitor 220 while control gate 221 forms the other plate of high capacitor 220. In one embodiment, floating gate capacitor 220 is not in an erased state. In one embodiment, the voltage $V_{div}$ on output line 240 is initialized at ground and the supply voltage $V_{pp}$ is positive forcing high capacitor 220 into accumulation mode.

The capacitor divider 210 of FIG. 2 has good tracking characteristics because the capacitance per unit area of both capacitors 220 and 230 is the same. The capacitive ratio (K) of the system is thus dependent on the plate area of the capacitors allowing for the area of each capacitor 220 or 230 for a given capacitive ratio (K) to be determinable before manufacturing capacitors 220 and 230. Capacitive divider 210 works well as described above when the voltage across the plates of high capacitor 220 is 5 volts or less.

As the voltage across the plates of high capacitor 220 exceeds 5 volts, a disturb problem (i.e., "the unintentional erasing of the floating gate 222 of high capacitor 220) would cause degradation of the performance of regulator 200. This disturb problem is due to the positive voltage $V_{pp}$ pulling electrons out of floating gate 222.

However, in other embodiments, low capacitor 230 is used with a high capacitor which prevents the above disturb problem even at voltages across the high capacitor greater than 5 volts (e.g. $V_{pp}$ is high).

Figure 1:
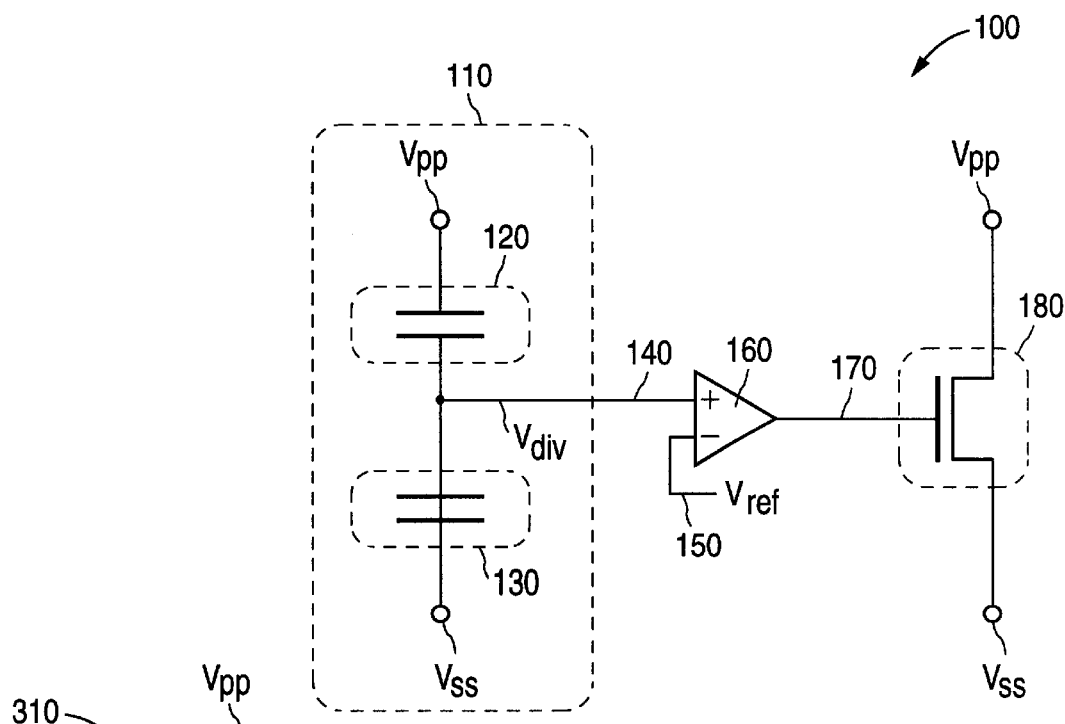
FIG. 1 shows a capacitor divider in a conventional voltage regulator.
Figure 3:
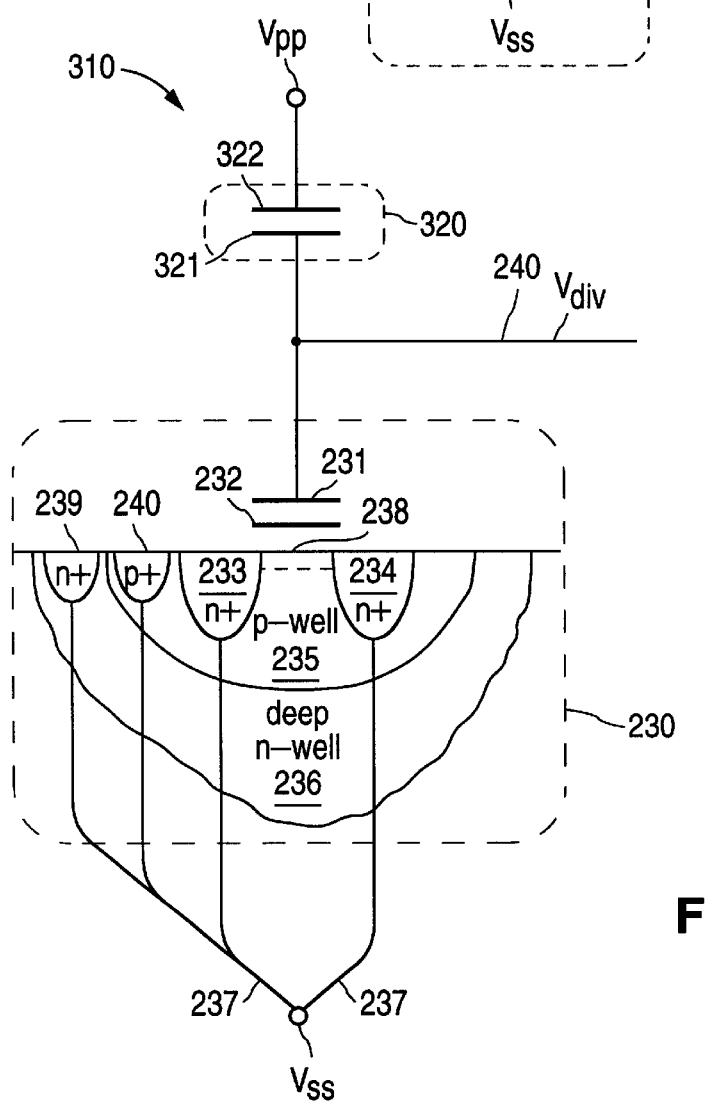
FIG. 3 is a diagram of a capacitor divider having a structure and method which avoids disturb problems even at high voltages across the high capacitor.

FIG. 3 is a diagram of a capacitor divider 310 having a structure and method which avoids the disturb problem even at high voltages across high capacitor 320. Capacitor divider 310 has the same elements of FIG. 2 except that a high voltage capacitor 320 (not having the floating gate structure of high capacitor 220 of FIG. 2) replaces high capacitor 220. High voltage capacitor 320 includes two plates 321 and 322 which, in one embodiment, are metal or polysilicon plates.

Figure 4:
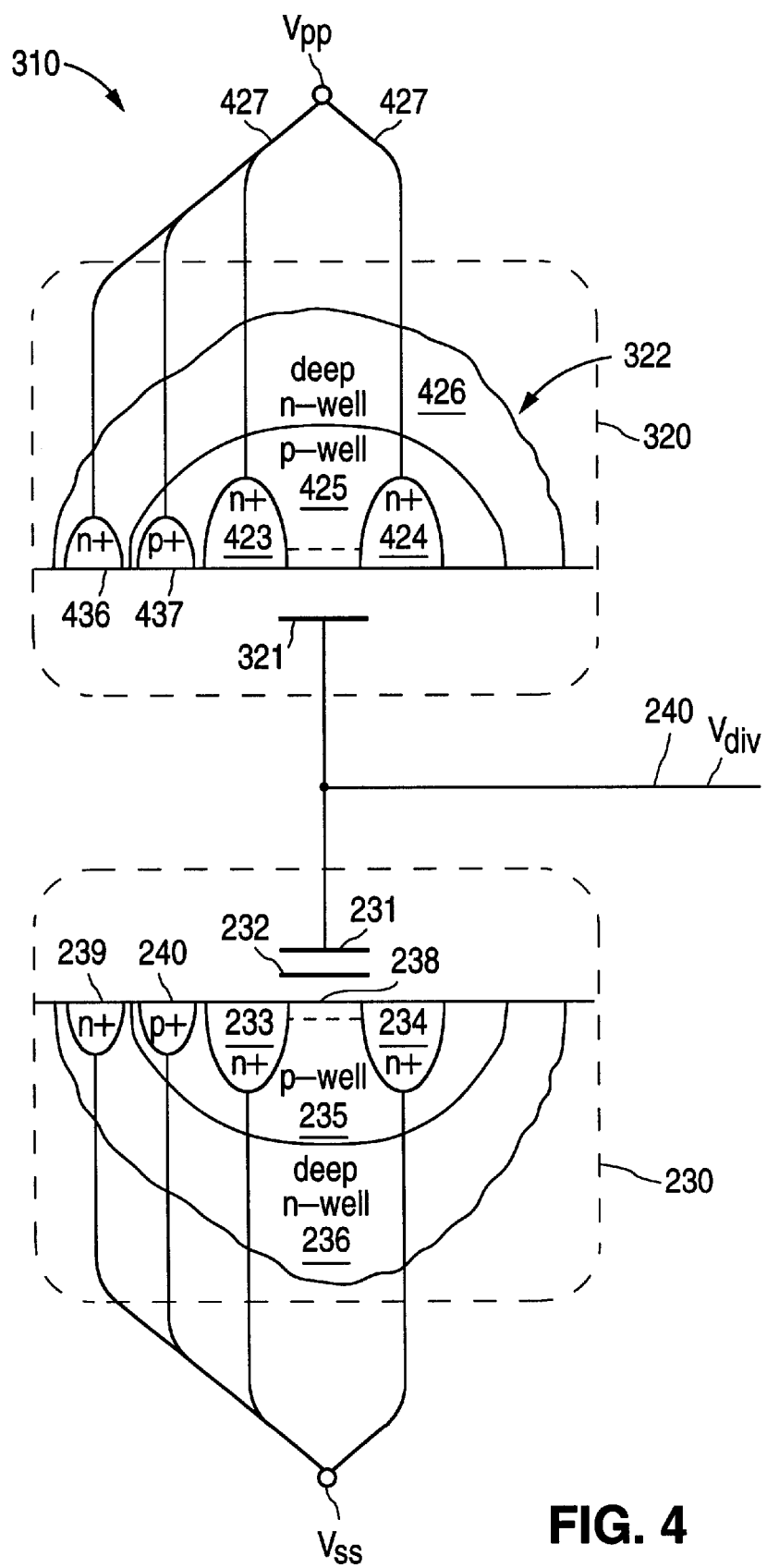
FIG. 4 is a diagram of the capacitor divider of FIG. 3 implementing a specific embodiment of the high voltage capacitor of FIG. 3.

FIG. 4 is a diagram of capacitor divider 310 of FIG. 3 implementing a specific embodiment of a high voltage capacitor 320. In the embodiment shown in FIG. 4, high voltage capacitor 320 includes p+ regions 423 and 424; p-well 425; deep n-well 426; and lines 427 coupling p+ regions 423 and 424, p-well 425, and deep n-well 426 to voltage source $V_{pp}$. Thus, p+ regions 423 and 424, p-well 425, deep n-well 426, and lines 427 are shorted together to form one plate of high capacitor 322 while control gate 321 forms the other plate of high capacitor 420. In one embodiment, the thickness of the silicon dioxide between the plates of high capacitor 420 is 400 Angstroms. In one embodiment, n+ and p+ contact regions 436 and 437 are formed within respective deep n-well 426 and p-well 425 in order to form a contact for short lines 427.

In order to manufacture capacitor dividers 310 with a predetermined capacitive ratio (k), the capacitance per unit plate area for each capacitor 230 and 320 must be known in order to determine the plate area of each capacitor 230 and 320 that would produce the predetermined capacitive ratio. In one embodiment, this is determined by measuring the capacitance of capacitors similar in structure to high voltage capacitor 320 (same dielectric thickness, plate material, plate configuration, etc.) and having a known plate areas.

Therefore, the present invention allows for a structure and method for obtaining a capacitor divider which has a predetermined capacitive ratio, operates at a variety of voltages across the high capacitor, and is compatible with a floating gate capacitor as low capacitor 230.

Although the above describes specific embodiments of the high voltage capacitor 320, it will be apparent from this disclosure that high voltage capacitor 320 may have other structures. Even though the above capacitor divider 310 has been described as being implemented in a voltage regulator, it will be apparent from this disclosure that capacitor divider 310 may also be successfully implemented into other applications.

Although the present invention has been described with reference to specific embodiments, these embodiments are illustrative only and not limiting. Many other applications and embodiments of the present invention will be apparent in light of this disclosure and the following claims.

What is claimed is:

1. A capacitor divider comprising:

a first and second voltage source, said second voltage source having a higher voltage than the voltage of said second voltage source;

a first capacitor having a first terminal and a second terminal, said first capacitor comprising a floating gate transistor structure, wherein said first terminal is coupled to a floating gate of said floating gate transistor structure, and said second terminal is coupled to a substrate of said floating gate transistor structure and said second voltage source; and a second capacitor without a floating gate structure and having a first terminal and a second terminal, said first terminal of said second capacitor being coupled to said first terminal of said first capacitor, and said second terminal of said second capacitor being coupled to said second voltage source.

2. The capacitor divider of claim 1 wherein said said second capacitor comprises a parallel-plate capacitor having metallic plates.

3. The capacitor divider of claim 1 wherein said said second capacitor comprises a parallel-plate capacitor having polycrystalline silicon plates.

4. The capacitor divider of claim 1 wherein said second capacitor comprises an MOS transistor structure.

5. The capacitor divider of claim 4 wherein said MOS transistor structure comprises a substrate region of a p-type conductivity.

6. The capacitor divider of claim 5 further including a plurality of p+ regions disposed within said substrate region.

7. The capacitor divider of claim 6 wherein said plurality of p+ regions comprises only two p+ regions.

8. The capacitor divider of claim 7 wherein MOS transistor structure comprises gate having a polycrystalline silicon layer.

9. The capacitor divider of claim 8 wherein said gate and said substrate region are approximately parallel.

10. The capacitor divider of claim 9 wherein said gate and said substrate region are separated by approximately 400 angstroms.

11. The capacitor divider of claim 10 wherein said capacitor divider is part of a regulator, said capacitor divider provides an output line coupled to said second terminal of said first capacitor.

12. The capacitor divider of claim 11 further comprising a comparator coupled to said output line and a reference voltage.

13. A method of providing a capacitor divider comprising the steps of:

providing a first voltage source and a second voltage source, said second voltage source having a voltage higher than said first voltage source;

providing a floating gate capacitor coupled between said first voltage source and an output terminal; and coupling a capacitor without a floating gate between said second terminal and said output terminal.

* * * * *